United States Patent [19]
Martinez et al.

[11] Patent Number: 5,644,606
[45] Date of Patent: Jul. 1, 1997

[54] RECEIVER WITH TWO SYNCHRONIZATION LOOPS

[75] Inventors: Georges Martinez, Caen; Jean-Michel Guillaud, Montgeron, both of France

[73] Assignee: U.S. Philips Corporation, New York, N.Y.

[21] Appl. No.: 518,872

[22] Filed: Aug. 24, 1995

[30] Foreign Application Priority Data

Aug. 25, 1994 [FR] France ................... 94 10278

[51] Int. Cl.$^6$ ............................................. H03D 3/24
[52] U.S. Cl. ........................................ 375/376; 375/326
[58] Field of Search .............................. 375/375, 377, 375/376, 326, 327; 327/156; 455/255, 256

[56] References Cited

U.S. PATENT DOCUMENTS

| | | | |
|---|---|---|---|
| 4,794,623 | 12/1988 | Levesque et al. | 375/86 |
| 5,440,268 | 8/1995 | Taga et al. | 375/327 |
| 5,541,965 | 7/1996 | Daffara | 375/326 |

*Primary Examiner*—Stephen Chin
*Assistant Examiner*—Betsy P. Lee
*Attorney, Agent, or Firm*—Steven R. Biren

[57] ABSTRACT

Digital transmission system (10) for digitally modulated signals, comprising a receiving device (14) which includes a demodulator (110), processing apparatus (120) and carrier synchronizing apparatus (16) for estimating and compensating for synchronization errors. The synchronizing apparatus includes a first loop (1) for phase/frequency correction and a second loop (2) for phase correction, the operation of these loops being controlled by a mode detector (130) depending on whether the receiving device is seeking to unlock or lock. The second loop (2) transforms a phase error signal into a phase correction signal which is mixed in mixer (246) with the signal coming from the demodulator. Preferably, the signals are modulated via a coded modulation.

16 Claims, 3 Drawing Sheets

RECEIVER WITH TWO SYNCHRONIZATION LOOPS

BACKGROUND OF THE INVENTION

1. Field of the Invention

The invention relates to a signal transmission system comprising a receiving device which includes a carrier synchronizer means for estimating and compensating for synchronization errors between a local carrier and a modulated input signal, while the device further includes an input signal demodulator which produces a demodulated signal, and a processor for processing the demodulated signal, the synchronizer comprising a first correction loop which includes, on the one hand, a phase/frequency detection detector for producing a first error signal, a first low-pass filter which has a first passband for filtering the first error signal, which filtered first error signal corrects the synchronization errors in the unlocked mode, and, on the other hand, a generator for generating the local carrier, and a second correction loop which includes a phase detector which produces a second error signal which corrects the synchronization errors in the locked mode, and a controller for controlling the loops and for putting the synchronizer either in the unlocked mode or in the locked mode.

2. Description of the Related Art

The invention also relates to a receiving device used especially in systems which utilize coded modulations via phase jumps (PSK) or via amplitude jumps and via phase jumps (QAM). Such systems may be used, for example, in digital television or telephony.

Carrier recovery circuits are known which utilize a carrier recovery loop which includes an oscillator whose voltage is controlled by an error signal that comes from the phase/frequency difference which indicates the out-of-sync between the local carrier produced by the oscillator and the transmit carrier.

A circuit of this type, but more sophisticated, is described, for example, in the document U.S. Pat. No. 4,794,623 which relates to a recovery of a carrier signal. For rapidly obtaining the frequency and the phase of the transmit carrier signal, this circuit utilizes two recovery channels which adjust the frequency and phase of a local oscillator to the transmit carrier signal. In a first period of time a phase/frequency detector appears for locking on to the local oscillator after which, in a second period of time, a phase detector effects a finer phase synchronization.

In addition, it is known that in a receiving device there is a drawback in that there is a delay of reaction in the carrier recovery loop, which delay elapses between the instant at which the input signal appears on the input of the device and the instant at which the processed input signals arrive which are necessary for the operation of the phase/frequency detector. This delay, which may be very long, is due to the processing of the input signal, such as in the demodulation, filtering, equalization, decision steps. The existence of such a delay leads to selecting the parameters of a carrier recovery loop by making compromises between various constraints of the system. Such a compromise is made, for example, between the maximum permissible value of the phase jitter and the minimum value of the natural frequency of the loop, which frequency occurs in the range of the acquisition domain and with respect to the robustness of the loop in respect of phase noise which is caused, for example, by microphonic effects.

SUMMARY OF THE INVENTION

It is an object of the invention to satisfy these various requirements in the best possible way.

This object is achieved by a transmission system for which the carrier synchronizer of the receiving device comprises a second loop which includes:

a) a second low-pass filter for filtering the second error signal, which second low-pass filter has a passband which is wider than the first passband to provide that the synchronization is robust to phase noise, b) a transformer for transforming the second error signal, after it has been filtered by the second filter, into a phase correction signal, while the output of the phase detector is connected to the processor, c) and a mixer connected between the demodulator and the processor, for mixing the demodulated signal with the phase correction signal.

The first loop is partly analog, while the phase/frequency detection means is realised in digital form. The natural frequency of the first loop is to be sufficiently low to do away with the processing delay of the input signal but, is nevertheless to be sufficiently high to guarantee frequency recovery.

The second loop is preferably completely digital, but it may also be analog. It may be programmable. Its natural frequency is to be higher than the natural frequency of the first loop to be suitable for following the corrections imposed by the first loop.

In the case where the two loops have a digital filtering, for taking non-linearities in the analog-m-digital conversion into account during the operation of the digital filter of the second loop, a leakage factor is used. Thus the second digital filter comprises:

a first adder which has a first input for receiving the second error signal, an output producing an output signal, a second input which is connected to the output across a loop circuit, while the loop circuit comprises in a series combination a delay means and a weightor that applies a leakage factor to the delayed output signal, a second adder which adds together the second error signal and the output signal of the first adder and produces a filtered error signal.

In the locked mode, the first loop and the second loop use the same error signal coming from the same phase detector. Thus, advantageously, false locking-on in the locked mode is avoided. The phase differences between the two loops thus continue to be constant, which makes it possible for the two loops always to be placed simultaneously in the same mode, either in the locked or in the unlocked mode.

These and other aspects of the invention will be apparent from and elucidated with reference to the embodiments described hereinafter.

BRIEF DESCRIPTION OF THE DRAWINGS

For a fuller understanding of the invention, reference is had to the following description taken in connection with the following drawings, in which.

DETAILED DESCRIPTION OF THE PREFERRED EMBODIMENTS

Figure 5:
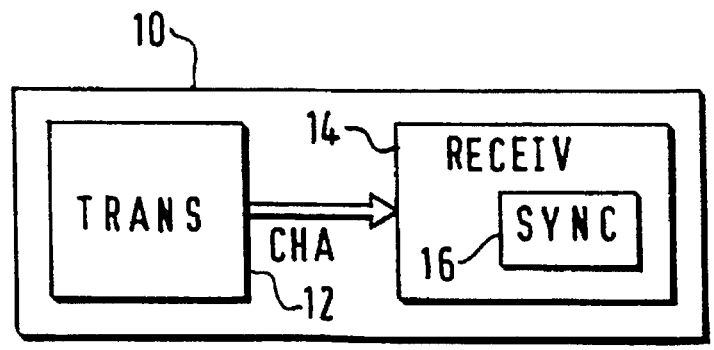
FIG. 5 shows a general circuit diagram of a transmission system.

FIG. 5 shows a diagram of a digital signal transmission system 10 which comprises a transmitter 12 which sends digitally modulated encoded data to a receiver 14. The transmission takes place by a channel CHA. The receiver comprises a synchronizer 16 SYNC for synchronizing a local carrier with the carrier from the transmitter 12.

Figure 1:
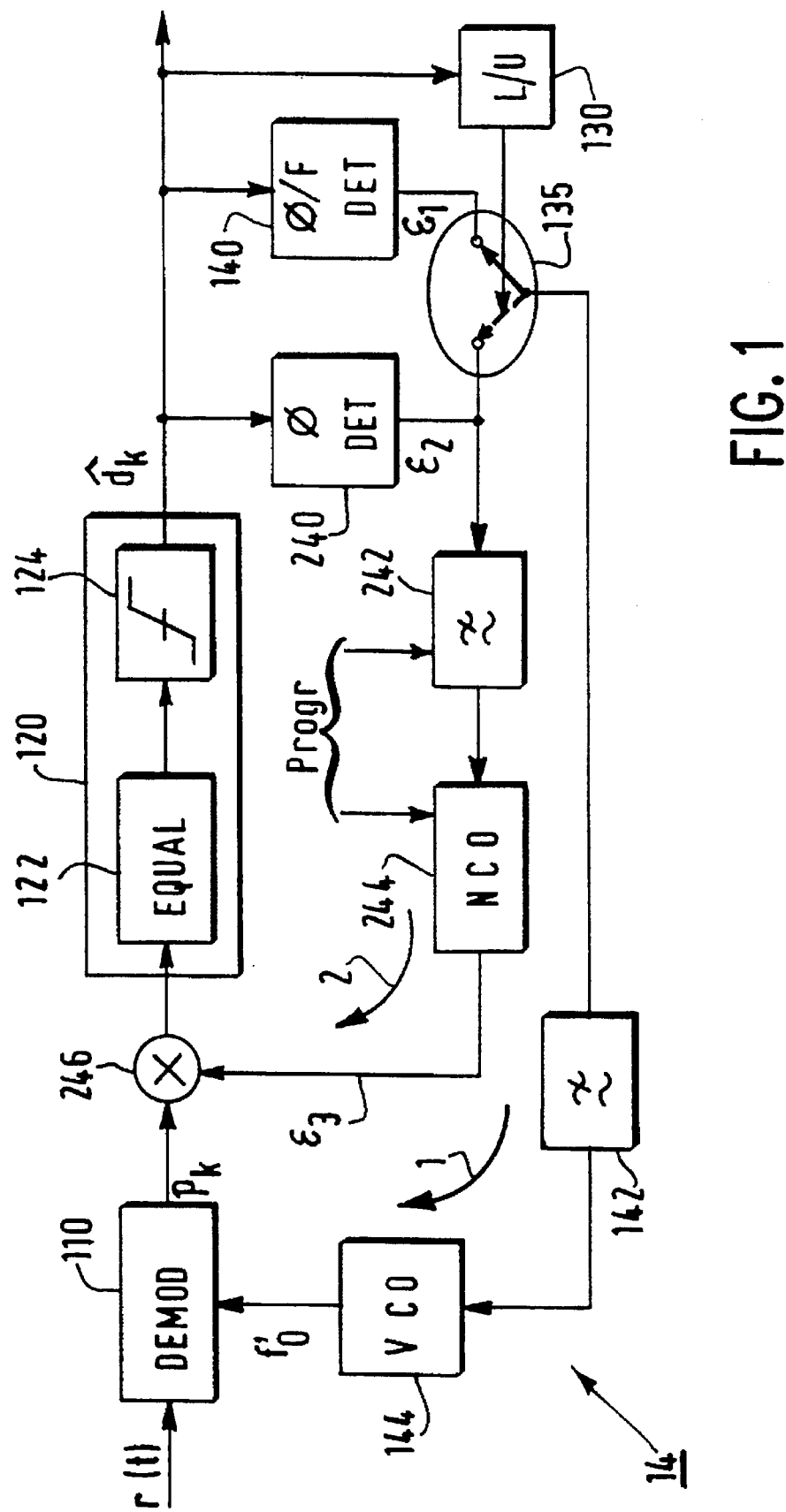
FIG. 1 shows a diagram of the receiving circuit comprising the two correction loops according to the invention.

FIG. 1 shows a diagram of the receiver 14 according to a preferred embodiment of the invention. The signal r(t) received at intermediate frequency IF is sampled and thereafter demodulated in a demodulator 110, so that a signal $p_k$ formed by in-phase component I and a quadrature component Q is produced. The index k is the sample number. A processor 120 processes the signal $p_k$ to produce symbols $\hat{d}_k$ which are estimates of the symbols $d_k$ of a coded modulation used at the transmitter end. The processor 120 comprises a decision circuit 124 preceded, as required, by an equalizer 122.

The carrier recovery circuit is used for establishing a frequency and phase synchronization of the local oscillator with the intermediate frequency carrier signal. In the case where there are frequency differences between the frequencies of the two carrier signals, and in so far as this frequency difference is compatible with the capturing range of the carrier recovery circuit, the carrier recovery circuit necessitate the frequency of the local oscillator to become identical with the frequency of the IF carrier signal, which makes the carrier recovery circuit to go from an unlocked mode (U) to a locked mode (L). When the frequency of the local oscillator is locked, the carrier recovery circuit performs a phase synchronization of the two carrier signals.

For employing these two modes of operation, the carrier recovery circuit comprises a first loop 1 which, in the unlocked mode, is used for frequency locking, and a second loop 2 which is subsequently used in the locked mode for phase synchronization, to compensate for synchronization errors caused by the first loop. The error signal of the phase detector is thus used for the two loops.

In the unlocked mode the first loop comprises a phase/frequency detector 140 which produces the first error signal el which is filtered by a first low-pass loop filter 142, while the first error signal thus filtered controls a voltage-controlled oscillator 144 VCO. The oscillator 144 produces a local carrier signal $F_0'$ which it keeps synchronized with the intermediate frequency carrier signal.

When the local oscillator has thus been frequency locked and possibly imperfectly phase-locked, it is generally necessary to perfect the phase synchronization for there may be considerable phase jitter. This is effected according to the invention by the second loop 2 which comprises a phase detector 240 which detector produces the second error signal $\epsilon2$ which is filtered by a second low-pass loop filter 242. The passband of the second filter is to cover higher frequencies than those covered by the first filter. The second error signal $\epsilon2$, after filtering, forms a control signal for a digital oscillator 244 which produces a phase correction signal $\epsilon3$. A mixer 246, connected between the demodulator 110 and the processor 120, mixes the sampled signal $p_k$ with the phase correction signal $\epsilon3$ to correct the phase of the signal $p_k$. The signal $p_k$ is formed by an in-phase and a quadrature component and, therefore, the phase correction signal $\epsilon3$ is also formed by two mutually quadrature components.

The phase/frequency detector 140 and the phase detector 240 are connected to an output of the processor 120. They may be connected either to an output of the decision circuit 124 or to the output of the equalizer 122. The detectors 140, 240 operate digitally.

The demodulator 110, the mixer 246 and the processor 120 preferably form a digital processor. Nevertheless, it is possible that all or certain of these elements form an analog processor in which case a sampler may be arranged either at the output of the demodulator 110, the mixer 246 or the processor 120 respectively, to obtain a mixed analog/digital operation.

The first loop 1 is to have a natural frequency which is sufficiently low to tolerate the processing delays caused by the processing that has been effected, but nevertheless be sufficiently high to ensure the recovery of the maximum frequency shift one wishes to obtain. This makes it possible for the system to be robust to microphone noise.

The natural frequency of a loop is determined by the time constants of the loop filter, the gain of the VCO, the static gain of the phase detector. The noise band of the loop is derived from this natural frequency.

The second loop 2 is to have a higher natural frequency than that of the first loop 1 in order to enable the second loop to make the corrections for the errors caused by the first loop.

When the oscillator 144 is locked (L mode), a mode detector 130 L/U activates switching means 135 which connect the first filter 142 to the output of the phase detector 240 to cause the first loop 1 to operate with the phase error signal $\epsilon2$ produced by the phase detector 240. Thus, by utilizing the same phase detector in the two loops, unlocking mode conflicts are avoided and the corrections called for by the loops 1 and 2 are always in phase.

The digital oscillator 244 NCO included in the second loop can be programmed by a command PROGR to modify the natural frequency of the loop.

Figure 2:
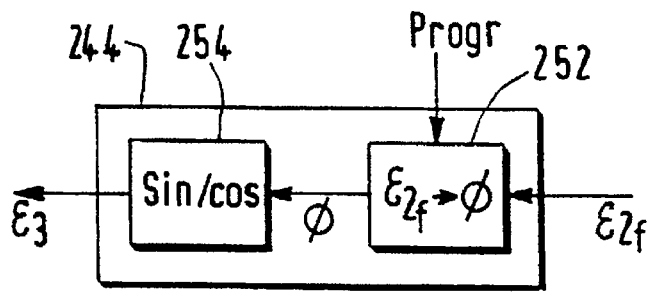
FIG. 2 shows a diagram of an embodiment for a digital oscillator.

Preferably, the digital oscillator 244 (FIG. 2) comprises a converter 252 which convert the phase error signal $\epsilon2$ (after filtering) into phase values $\phi$ which are used for an addressing generator 254 for generating values of the correction signal $\epsilon3$ in a form of sine/cosine values of the phase $\phi$. The generator 254 may be formed by a look-up Table stored, for example, in a memory.

Figure 3:
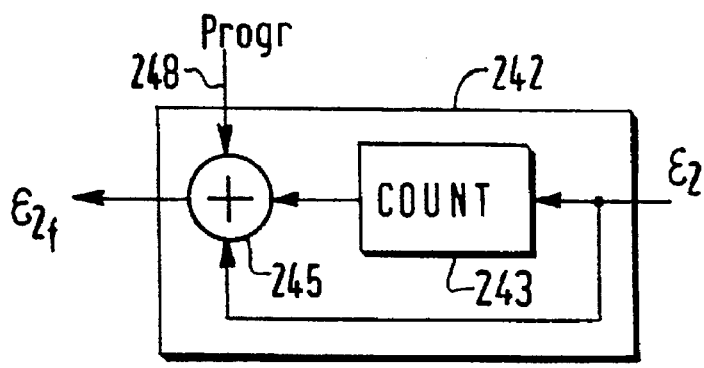
FIG. 3 shows a diagram of an embodiment for a digital filter.

According to a particular embodiment, the filter 242 of the second loop comprise (FIG. 3) an up/down counter 243 COUNT which accumulates values of the signal having phase $\epsilon2$ ($\epsilon2$ may assume the values $-1$, 0 or $+1$). The output of the counter 243 is added up in an adder 245 to the current value of the phase signal $\epsilon2$. The output of the adder 245 produces a filtered signal $\epsilon2_f$. The adder 245 has an additional input 248 which makes it possible for this adder to receive programming values PROGR to modify the characteristic features of the filter 242.

Figure 4:
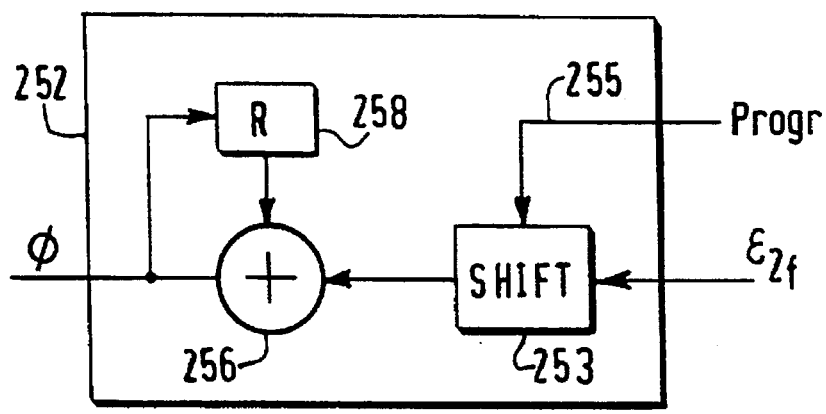
FIG. 4 shows a diagram of an illustrative embodiment for transforming means for transforming the error signal $\epsilon 2$ into phase values $\phi$.

FIG. 4 depicts a transformer 252 for transforming phase errors into phase values. The filtered signal $\epsilon2_f$ enters shifter 253 SHIFT which has another input 255 to receive a programming value PROGR to modify the characteristic features of the transformer 252. The output signal of the shift means enters the accumulator which accumulates a sequence of values of the filtered signal $\epsilon2_f$. The accumulator comprises in a closed loop arrangement an adder 256 and a register 258. The output of the adder 256 produces successive phase values φ which are used for addressing the generator 254 which generates the two quadrature components of the correction signal ε3.

The first filter 142 may be analog or digital, whence the necessity to make a digital-to-analog conversion either upstream or downstream of the first filter 142. In the case where this conversion is made upstream of the first filter 142, it may be useful taking non-linearities into account which are caused by a conversion made to avoid the drifting of the locking frequency of the oscillator 144. This is caused by the fact that, in the case where the first filter is a perfect or near-perfect integrator, this integrator gradually accumulates the developing non-linearities in loop 1, in the form of low-amplitude DC components which have just been added to the error signal produced by the phase/frequency detector 140 or the phase detector 240. This relates to, for example, a residual voltage on the output of the digital-to-analog converter when there is no signal available on the input. This forms a malfunctioning that causes frequency drift which has thus to be compensated for by influencing the loop 2.

To compensate for the frequency drift, the second filter 242 is utilized. To this end a leakage factor α is used for the operation of the second low-pass loop filter 242. By giving a value smaller than 1, for example, 1 $\frac{1}{32}$ to this leakage factor α, it is guaranteed that the follow-up of the phase tracking will, in essence, not be realised by the loop 2, and thus that the loop 1 will be able to compensate for the frequency offset, while loop 2 reacts more rapidly than loop 1.

Figure 7:
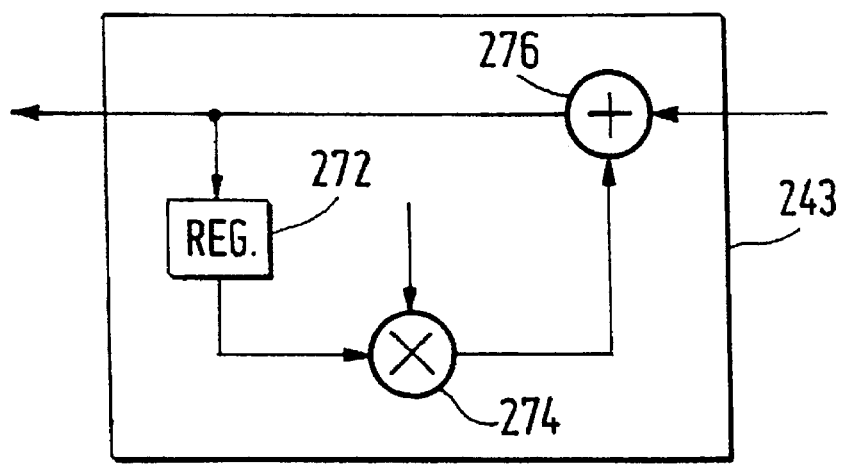
FIG. 7 shows a diagram of a filter included in the second loop, which filter is modified for taking non-linearities of a digital-to-analog conversion into account.

This leakage factor α is only justified in the case where the digital-to-analog conversion is carried out upstream of the first filter 142. In practice this is obtained by giving the counter 243 the structure of FIG. 7. The counter 243 then comprises an adder 276 which has a first input which receives the signal ε2 and an output which is connected to a loop circuit that includes a register 272 which stores, during a cycle, the output value of the adder 276, which delayed output value is fed to a multiplier 274 which multiplies this value by the leakage factor α and thus produces a corrected value which is applied to the second input of the adder 276.

The first and second loops may receive different signals depending on whether the carrier synchronizer are in the unlocked mode (U) or in the locked mode (L). Table I which follows gives a summary of the various possibilities.

|  | U |  | L |
|---|---|---|---|
| first loop | ε1 |  | ε2 |
| second loop | NO | ε2 | ε2 |

Figure 6A:
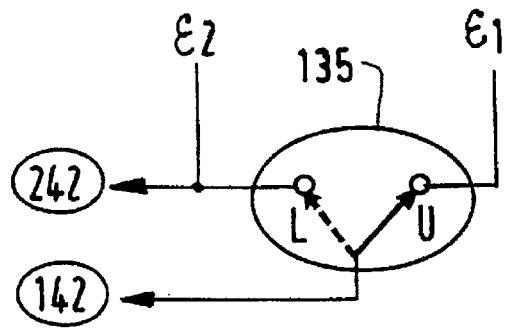
FIGS. 6A and 6B show diagrams of two configurations of embodiments for switch means which make it possible for the two loops to function.
Figure 6B:
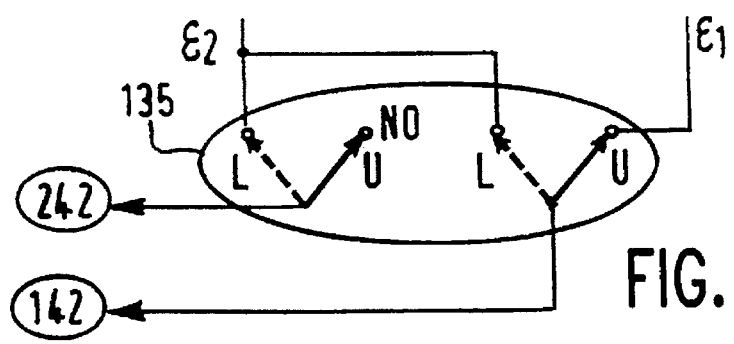

FIGS. 6A, 6B show various ways of switching by means of switch means 135.

FIG. 6A shows the preferred mode of FIG. 1 for which one has:

U mode: first loop: ε1
second loop: ε2
L mode: first loop: ε2
second loop: ε2
For FIG. 6B:
U mode: first loop: ε1
second loop: NO
L mode: first loop: ε2
second loop: ε2
for which "NO" denotes that the n the unlocked mode.

What is claimed is:

1. A signal transmission system comprising a receiving device which includes carrier synchronizing means for estimating and compensating for synchronization errors between a local carrier and a modulated input signal, while the device further includes input signal demodulation means which produce a demodulated signal, and processing means for recovering estimated symbols from the demodulated signal, the synchronizing means comprising a first correction loop which includes, on the one hand, phase/frequency detection means for producing a first error signal, first low-pass filter means which have a first passband for filtering the first error signal, which filtered first error signal corrects the synchronization errors in an unlocked mode, and, on the other hand, means for generating the local carrier, and a second correction loop which includes phase detection means which produce a second error signal which corrects the synchronization errors in a locked mode, and means for controlling the loops and for putting the synchronizing means either in the unlocked mode or in the locked mode, wherein the second loop includes second low-pass filter means for filtering the second error signal, which second low-pass filter means have a passband which is wider than the first passband to provide that the synchronization is robust to phase noise, transforming means for transforming the second error signal, after it has been filtered by the second filter means, into a phase correction signal, while the the phase detection means is connected to the output of the processing means, and mixing means connected between the demodulation means and the processing means, for mixing the demodulated signal with the phase correction signal.

2. The system as claimed in claim 1, wherein the first filter and the second filter are digital filters and the second filter includes:

a first adder which has a first input for receiving the second error signal, an output producing an output signal, a second input which is coupled to the output across a loop circuit, while the loop circuit comprises in a series combination a delay means and weighting means that applies a leakage factor to a delayed output signal, and a second adder which adds together the second error signal and the output signal of the first adder and produces a filtered error signal.

3. The system as claimed in claim 1, wherein the means for transforming the second error signal into a phase correction signal includes converting means which convert the filtered error signal into a phase signal and means for generating two sine/cosine components of the signal having phase, which components form the phase correction signal.

4. The system as claimed in claim 3, wherein the means for generating the two sine/cosine components comprise a memory that stores a look-up Table.

5. A receiving device for use in a digital transmission system as claimed in claim 1.

6. The system as claimed in claim 2, wherein the means for transforming the second error signal into a phase correction signal includes converting means which convert the filtered error signal into a phase signal and means for generating two sine/cosine components of the signal having phase, which components form the phase correction signal.

7. A receiving device for use in a digital transmission system as claimed in claim 2.

8. A receiving device for use in a digital transmission system as claimed in claim 3.

9. A receiving device for use in a digital transmission system as claimed in claim 4.

10. A receiving device for use in a digital transmission system as claimed in claim 6.

11. A signal transmission system comprising: an oscillator for generating a local carrier; a receiving device having a carrier synchronizer for estimating and compensating for synchronization errors between the local carrier and a modulated input signal; an input signal demodulator for producing a demodulated signal; a processor for recovering estimated symbols from the demodulated signal; a phase/frequency detector for producing a first error signal, a first filter for filtering the first error signal which corrects the synchronization errors in an unlocked mode; a phase detector for producing a second error signal which corrects the synchronization errors in a locked mode;

a second filter for filtering the second error signal, said second filter having a passband wider than a passband of the first filter;

a transformer for transforming the second error signal, after it has been filtered by the second filter, into a phase correction signal while the phase detector is connected to the output of the processor;

a mixer connected between the demodulator and the processor for mixing the demodulated signal with the phase correction signal; and a switcher for switching the synchronizer from one of an unlocked mode and a locked mode to the other of an unlocked and locked mode.

12. The system as claimed in claim 11, wherein the second filter includes a first adder having a first input for receiving the second error signal, an output producing an output signal, a second input coupled to the output of a loop circuit, said loop circuit including delay means and weighting means that applies a leakage factor to a delayed output signal, and a second adder which adds together the second error signal and the output signal of the first adder and produces a filtered error signal.

13. The system as claimed in claim 11, wherein the transformer includes a converter for converting the filtered error signal into a phase signal and a generator for generating two sine/cosine components of the signal having phase and which form the phase correction signal.

14. The system as claimed in claim 13, wherein the generator includes a memory that stores a look-up Table.

15. A receiving device for use in a digital transmission system as claimed in claim 11.

16. The system as claimed in claim 11, wherein the first filter and the second filter are digital filters.

* * * * *